US012560179B2

(12) United States Patent
Kumar et al.

(10) Patent No.: US 12,560,179 B2
(45) Date of Patent: Feb. 24, 2026

(54) PASSIVE NOISE DISSIPATOR FOR LAPTOP COOLING FANS

(71) Applicant: Intel Corporation, Santa Clara, CA (US)

(72) Inventors: Amit Kumar, Bangalore (IN); Rachit Garg, Bangalore (IN); Arnab Sen, Whitefield (IN); Ruander Cardenas, Portland, OR (US); Prasanna Pichumani, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/731,058

(22) Filed: May 31, 2024

(65) Prior Publication Data

US 2025/0369452 A1      Dec. 4, 2025

(51) Int. Cl.
*F04D 29/66* (2006.01)
*F04D 17/08* (2006.01)
*F04D 29/02* (2006.01)
*H05K 7/20* (2006.01)

(52) U.S. Cl.
CPC .......... *F04D 29/664* (2013.01); *F04D 17/08* (2013.01); *F04D 29/023* (2013.01); *H05K 7/20154* (2013.01)

(58) Field of Classification Search
CPC ...... G06F 1/20; G06F 1/203; G06F 2200/201; F04D 17/167; F04D 29/023; F04D 29/281; F04D 29/4226; F04D 29/664; F04D 29/666; F04D 17/16; F04D 29/663;

F04D 17/04; F04D 29/703; F04D 17/08; F04D 25/0613; F04D 25/082; H05K 7/20154; H05K 7/20136; F05D 2300/612; F05D 2300/514

See application file for complete search history.

(56) References Cited

U.S. PATENT DOCUMENTS

| | | | | |
|---|---|---|---|---|
| 5,336,046 A * | 8/1994 | Hashimoto | ......... | F04D 29/5806 |
| | | | | 415/214.1 |
| 7,492,588 B2 * | 2/2009 | Hwang | .............. | H05K 7/20154 |
| | | | | 361/694 |
| 9,134,757 B2 * | 9/2015 | Nishi | ..................... | G06F 1/1616 |
| 9,453,513 B2 * | 9/2016 | Chen | ....................... | F04D 17/16 |
| 9,746,001 B2 * | 8/2017 | MacDonald | .......... | F04D 29/666 |
| 10,816,011 B2 * | 10/2020 | Lin | ..................... | F04D 29/5853 |
| 11,118,598 B2 * | 9/2021 | Kennedy | ................... | G06F 1/20 |
| 11,628,318 B1 * | 4/2023 | Wedding | .............. | A62B 18/006 |
| | | | | 128/205.12 |
| 2008/0247134 A1 * | 10/2008 | Hwang | .............. | H05K 7/20154 |
| | | | | 361/695 |
| 2013/0327507 A1 * | 12/2013 | Degner | ................ | H05K 7/2039 |
| | | | | 361/695 |

* cited by examiner

*Primary Examiner* — Eric J Zamora Alvarez
(74) *Attorney, Agent, or Firm* — Alliance IP, LLC

(57) ABSTRACT

In one embodiment, a blower apparatus includes a housing defining an inlet opening and an outlet opening. The blower apparatus also includes a fan within the housing and a porous material coupled to the housing. The porous material is disposed over at least a portion of the inlet opening of the housing.

19 Claims, 12 Drawing Sheets

FIG. 7
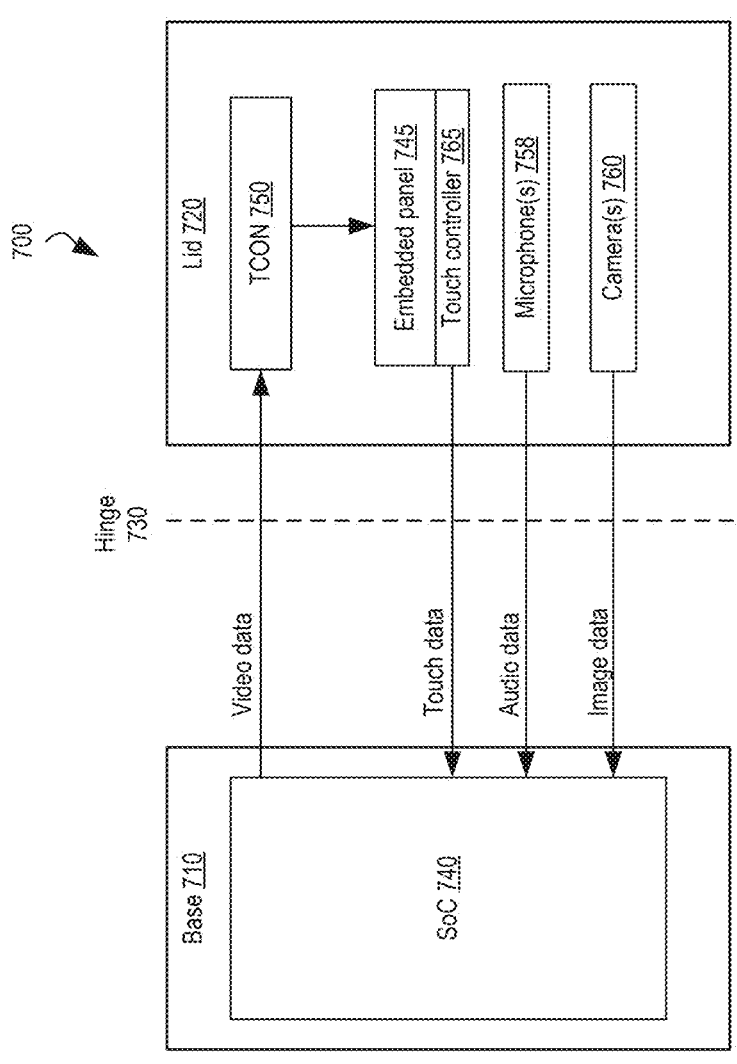

PASSIVE NOISE DISSIPATOR FOR LAPTOP COOLING FANS

BACKGROUND

Cooling fans in mobile devices, e.g., laptop computers, are a critical thermal design component to prevent overheating of the circuitry of the device, e.g., one or more processors of the device. Cooling requirements continue to become more stringent as the devices both consume more power and are reduced in size. In addition, users demand quieter operation of such devices as well.

BRIEF DESCRIPTION OF THE DRAWINGS

FIG. 7 illustrates an example block diagram of a computing device in which aspects of the present disclosure may be incorporated.

DETAILED DESCRIPTION

Figure 1A:
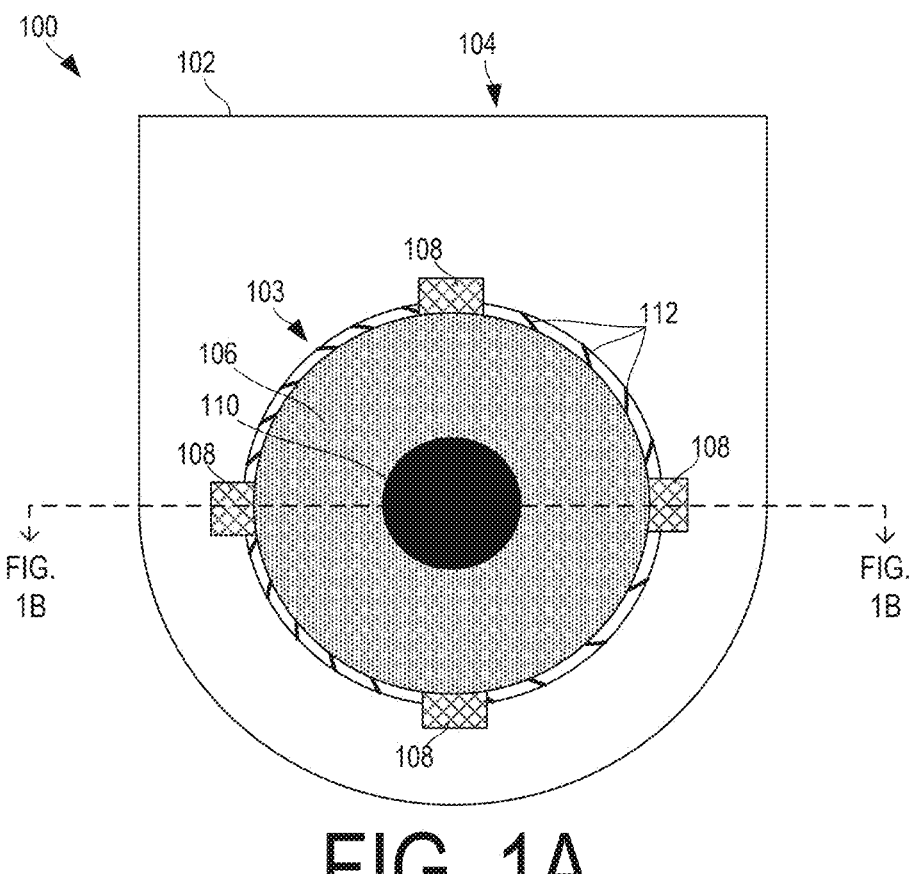
FIGS. 1A-1B illustrate an example blower apparatus with a passive noise dissipator in accordance with embodiments of the present disclosure.

In the following description, specific details are set forth, but aspects of the technologies described herein may be practiced without these specific details. Well-known circuits, structures, and techniques have not been shown in detail to avoid obscuring an understanding of this description. "An embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact with each other and "coupled" may indicate elements co-operate or interact with each other, but they may or may not be in direct physical or electrical contact. Terms modified by the word "substantially" include arrangements, orientations, spacings, or positions that vary slightly from the meaning of the unmodified term. For example, description of a lid of a mobile computing device that can rotate to substantially 360 degrees with respect to a base of the mobile computing includes lids that can rotate to within several degrees of 360 degrees with respect to a device base.

The description may use the phrases "in an embodiment," "in embodiments," "in some embodiments," and/or "in various embodiments," each of which may refer to one or more of the same or different embodiments. Furthermore, the terms "comprising," "including," "having," and the like, as used with respect to aspects of the present disclosure, are synonymous.

Reference is now made to the drawings, which are not necessarily drawn to scale, wherein similar or same numbers may be used to designate same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives within the scope of the claims. While aspects of the present disclosure may be used in any suitable type of computing device, the examples below describe example mobile computing devices/environments in which aspects of the present disclosure can be implemented.

Aspects of the present disclosure provide fan casing designs for mobile devices, such as laptop computers, that can provide better overall iso-acoustic P-Q curves. Flow inlets of blower apparatuses can be a major contributor to noise for blower apparatuses (e.g., centrifugal blowers) because of high turbulence levels in those regions caused by the interaction between the air and the rotor during onboarding of air into the blade flow passages. To reduce noise, particular embodiments may implement a blower apparatus that includes a porous material structure over an inlet opening of the apparatus (e.g., substantially covering the inlet). The porous material structure can accordingly act as a noise absorber, while also causing minimal changes in air flow resistance to existing designs. In addition, the porous material can aid in reducing the back flow of air from the inlet region of the apparatus.

In addition, the porous material structure may be relatively thin, such that the structure does not interfere with other components of the device in which the apparatus is implemented. Accordingly, embodiments herein can be integrated with a top cover of a device (e.g., a laptop computer) and might not have any impact on overall height as compared with existing blower apparatuses.

Figure 1B:
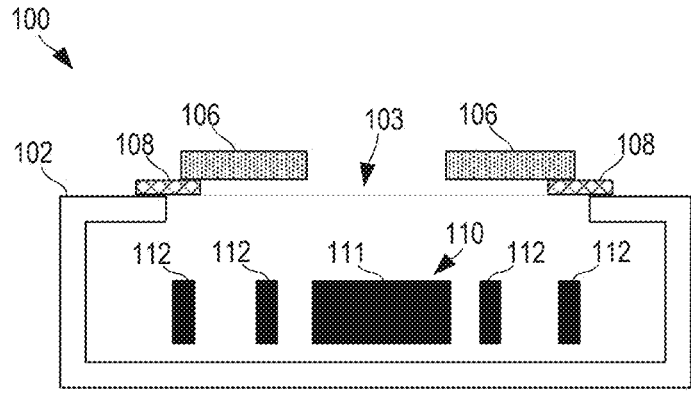

FIGS. 1A-1B illustrate an example blower apparatus 100 with a passive noise dissipator in accordance with embodiments of the present disclosure. The example blower apparatus 100 may be used, in certain cases, as a cooling fan in a computing device, e.g., a laptop computing device or other mobile device.

The example blower apparatus 100 includes a housing 102 in which a impeller 110 is located. The blower apparatus 100 shown is implemented with a centrifugal fan design, with a impeller 110 that includes a central hub 111 and blades 112 extending therefrom; however, other embodiments may include other types of impellers within the housing 102. The housing 102 includes an inlet opening 103 and an outlet opening 104. During operation, the blades 112 rotate, causing air to flow into the housing 102 through the inlet opening 103 and then out of the housing 102 through the outlet opening 104.

As shown, the blower apparatus 100 includes an annular-shaped disc 106 of porous material coupled to the housing 102 adjacent the inlet opening 103. More particularly, the disc 106 is positioned over at least a portion of inlet opening 103 as shown, e.g., at least 10% or at least 25% of the inlet opening 103. In the example shown, the disc 106 is annular-shaped so as to not cover the area of the inlet opening 103 adjacent the central hub 111 of the impeller 110, which can aid to reduce overall air resistance added by the disc 106 and accordingly avoid adverse impacts on the fan discharge rate. However, in other embodiments, the porous material may be formed in another shape, e.g., circular or rectangular. In some embodiments, the disc 106 substantially covers the inlet opening 103, e.g., the disc 106 may be positioned over at least a majority of the area of the inlet opening. In other embodiments, e.g., in the example shown, the disc 106 is positioned such that it covers a majority of the area immediately above the blades 112 of the impeller 110.

In certain embodiments, the disc 106 may be formed with an open cell foam material, such as a metal foam material comprising, e.g., nickel or aluminum. The open cell foam material may have a generally random porous cell structure with relatively high porosity, e.g., between approximately 0.8-0.98 porosity or between approximately 30-300 pores per inch. Length scales of pores inside such a foam may be smaller than audible noise wavelengths, hence sound waves in the audible range may undergo acoustic dissipation as they travels through the foam, resulting in a reduction of overall noise perceived at Iso-angular speed conditions. Accordingly, the cell structure may provide dissipation of noise within approximately 2-8 kHz.

In the example shown, the porous disc 106 is coupled to the housing 102 via attachment mechanisms 108, which may be implemented as adhesive tape or another type of adhesive material in certain embodiments. In some embodiments, the attachment mechanisms 108 may be rigid and themselves be adhered to the housing 102, or may be rigid and integrated with the housing 102. However, in other embodiments, the porous disc 106 may be integrated with the housing 102.

Figure 2A:
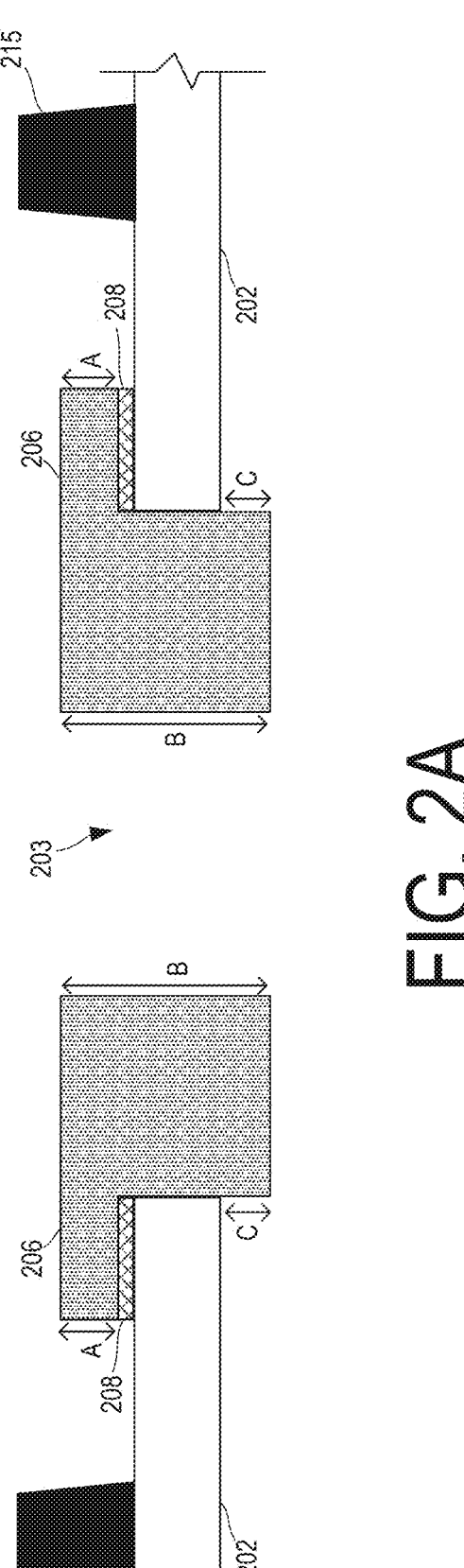
FIGS. 2A-2B illustrate other example embodiments of a passive noise dissipator implemented in a cooling fan apparatus.
Figure 2B:
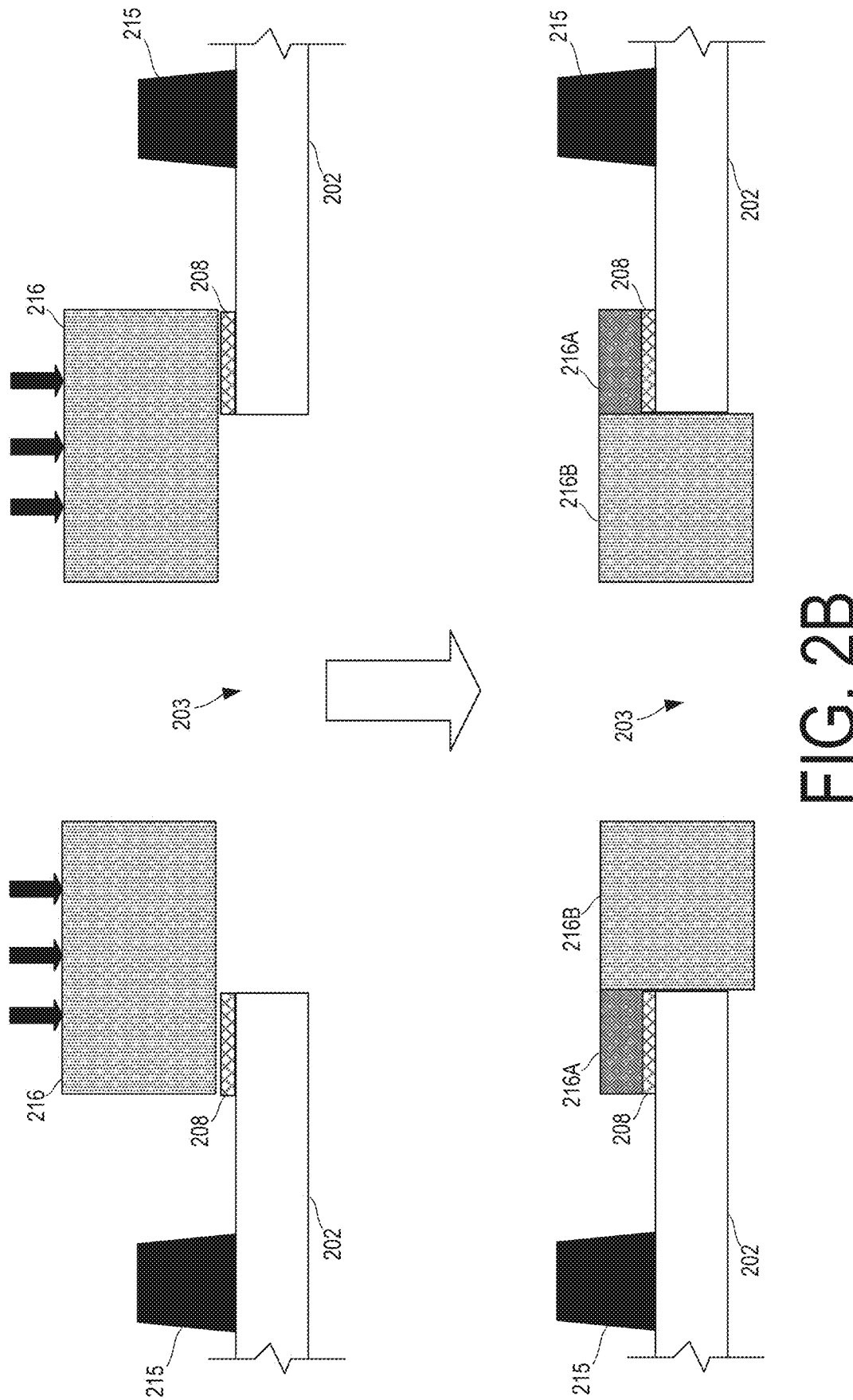

FIGS. 2A-2B illustrate other example embodiments of a passive noise dissipator implemented in a cooling fan apparatus. In particular, FIGS. 2A-2B illustrate views of porous material discs 206, 216 that are similar to the disc 106 described above, as well as their coupling with a housing 202 of a blower apparatus (e.g., housing 102). In each case, only one surface of the housing 202 is shown; however, it will be understood that the housing 202 can include additional surface as well (e.g. similar to the housing 102 of FIGS. 1A-1B).

Referring to FIG. 2A, the porous disc 206 is coupled to the housing 202 via an adhesive 208 or other type of attachment mechanism, with a first portion of the disc 206 being positioned above the housing 202 and a second portion of the disc 206 being positioned over the opening 203 in the housing (which may be similar to the inlet opening 103 above). The first portion of the disc 206 has a first thickness "A" (e.g., approximately 1 mm), while the second portion of the disc 206 has a greater thickness "B" (e.g., approximately 2-3 mm). Further, as shown, the second portion of the disc 206 is positioned such that a portion thereof is within the opening 203, and even extends into the housing by a measure "C" as indicated (e.g., approximately 0.5 mm). In the example shown, the porosity of the disc 206 is generally constant throughout both the first and second portions (in contrast, for example, to the example shown in FIG. 2B and described further below). The disc 206 may be formed via cutting of the porous material (to maintain the generally constant porosity) prior to attachment to the housing 202.

Referring now to FIG. 2B, the example porous disc 216 is coupled to the housing 202 in a similar manner as the example of FIG. 2A, e.g., the disc 216 is positioned in the same manner with respect to the opening 203 as the disc 206 above. However, in the example shown, the disc 216 is initially formed as a disc with a generally constant porosity and then pressed onto the housing 202 as shown, coupling to the housing 202 via the same adhesive 208 or similar attachment mechanism. Due to this manner of attachment, the first portion of the disc 216A above the housing 202 is compressed and accordingly results in a lower porosity than the portion 216B that is above/inside the opening 203.

In addition, each example embodiment further includes bossing features 215 that extend above the thickness of the porous disc 206, 216. The bossing features 215 may be features that are generally implemented in current blower apparatuses, e.g., to prevent structural damage to the housing during device manufacturing or for other reasons. Accordingly, it will be seen that the porous material discs can be implemented in current designs without additional dimensional issues, e.g., without extending above the bossing features 215.

Figure 3:
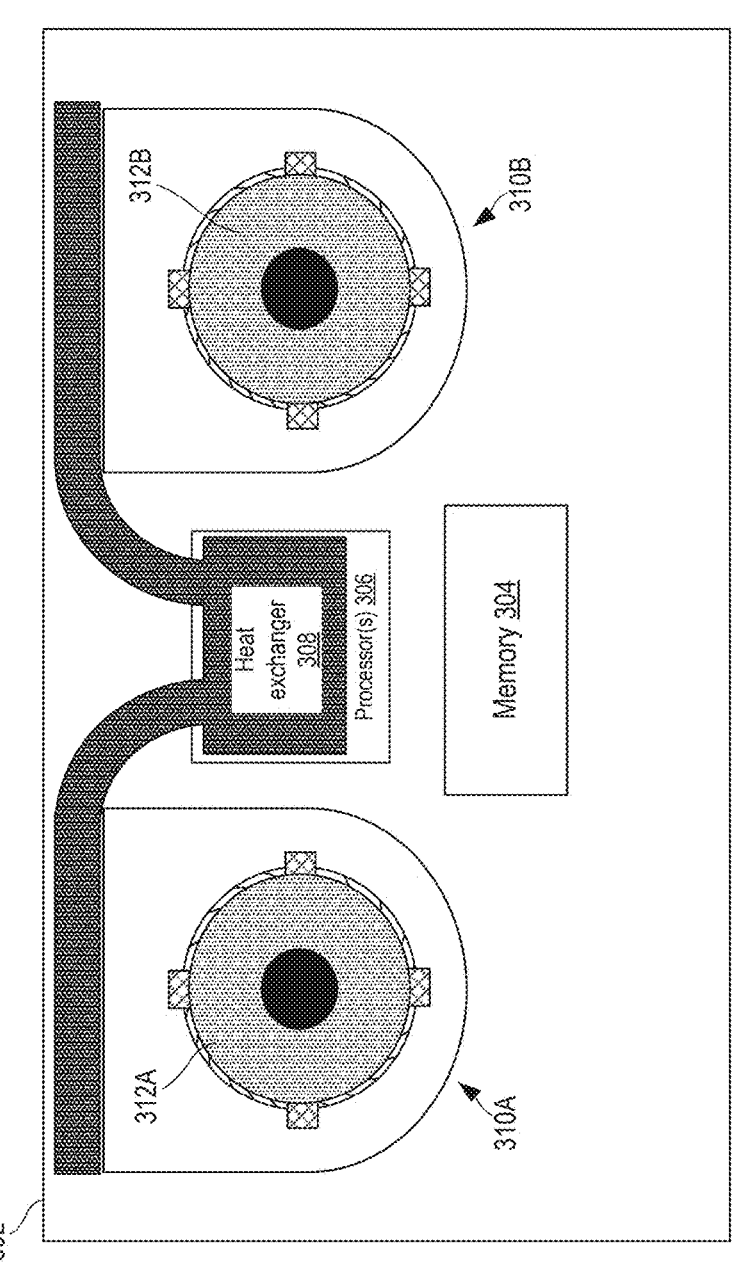
FIG. 3 illustrates a computing device incorporating a blower apparatus of the present disclosure.
Figure 3:

FIG. 3 illustrates a computing device 300 incorporating a blower apparatus 310 of the present disclosure. The example computing device 300 includes a device housing 302 in which one or more processors 306 and memory 304 are located. The device 300 further includes a heat exchanger 308 coupled (e.g., thermally coupled) to the processor(s) 306 to remove heat therefrom. The device 300 further includes two blower apparatuses 310A, 310B that are implemented in the same or similar manner as described above, i.e., with a porous disc 312A, 312B over at least a portion of the inlet openings of the apparatuses 310A, 310B, respectively. The apparatuses are positioned such that their respective outlets are adjacent to a portion of the heat exchanger 308 (e.g., adjacent to heat pipes of the heat exchanger 308 extending away from the portion of the heat exchanger 308 over the processor(s) 306). In this manner, the blower apparatuses 310A, 310B can blow air across portions of the heat exchanger 308, providing convection cooling to the heat exchanger and accordingly providing additional cooling to the processor(s) 306.

Figure 4A:
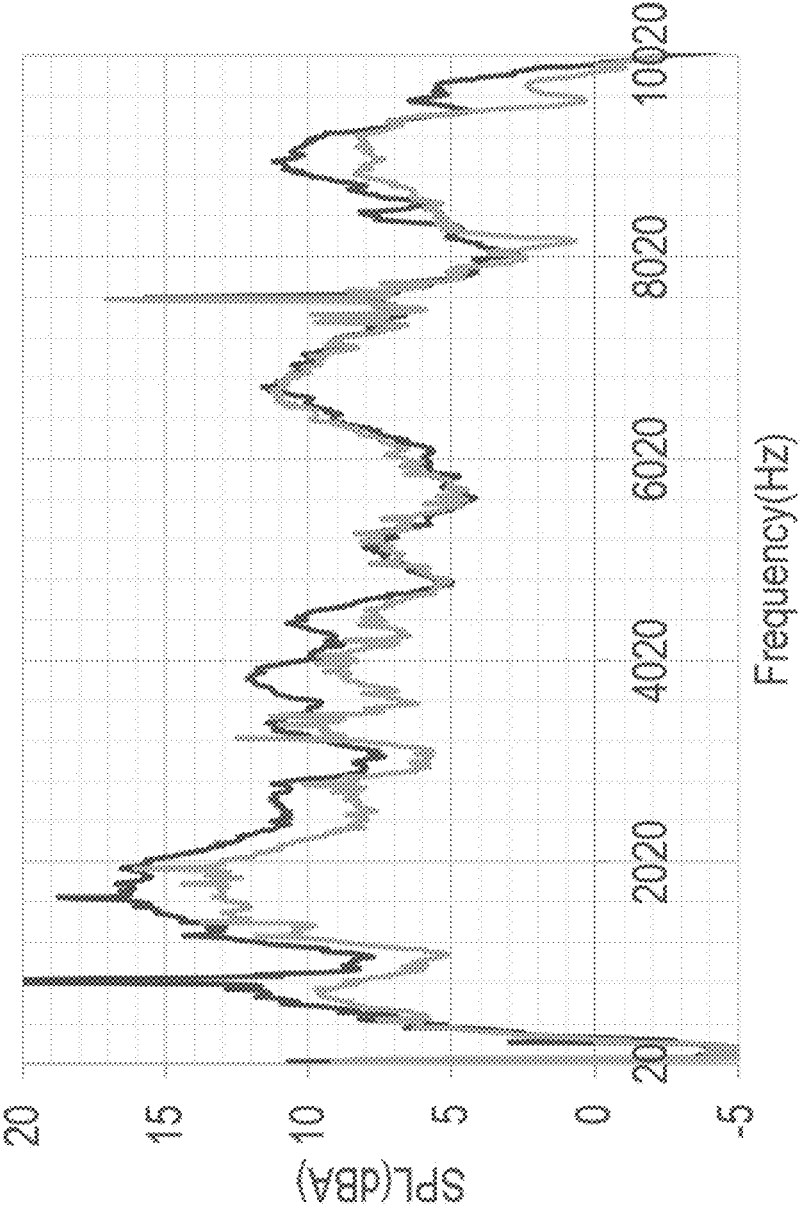
FIGS. 4A-4C illustrate example experimental data showing the benefits of a passive noise dissipator of the present disclosure.
Figure 4B:
Figure 4C:

FIGS. 4A-4C illustrate example experimental data showing the benefits of a passive noise dissipator of the present disclosure. The example data are based on a porous material disc coupled to 75×75×5 mm blower apparatus; in particular, based on a porous annular disc on top of a primary inlet of a blower apparatus as shown in FIGS. 1A-1B.

FIG. 4A illustrates a spectral plot 400A for a baseline case (the blower apparatus without the porous annular disc) and a "modified" case with the porous annular disc coupled to the blower apparatus. The data in FIG. 4A are for a fan speed of 4500 rpm. As shown, the porous annular disc showed a significant reduction in SPL in the audible frequency range of 400-5000 Hz, with a 2dBA reduction in Overall SPL for the apparatus with the porous annular disc.

FIG. 4B illustrates a plot 400B showing overall SPL levels vs angular speed of the fan, for both the "baseline" and "modified" cases described above. As can be seen, for the same Overall SPL, a blower apparatus with the porous annular disc is able to rotate at higher angular speeds than one without the disc, indicating potential of higher fan performance in terms of P-Q characteristics.

FIG. 4C illustrates a plot 400C of example P-Q curves for the same "baseline" and "modified" cases at different iso-acoustic levels (25 dBA, 34 dbA, and 38 dBA). As shown, the blower apparatus with the porous annular disc can provide an approximate 10-15% improvement in P-Q characteristics as compared with the baseline apparatus without the porous annular disc. This may occur mainly due to the increase in fan speed allowed for the same Overall SPL when the porous annular disc is present.

Example Computing Systems

Figure 5:
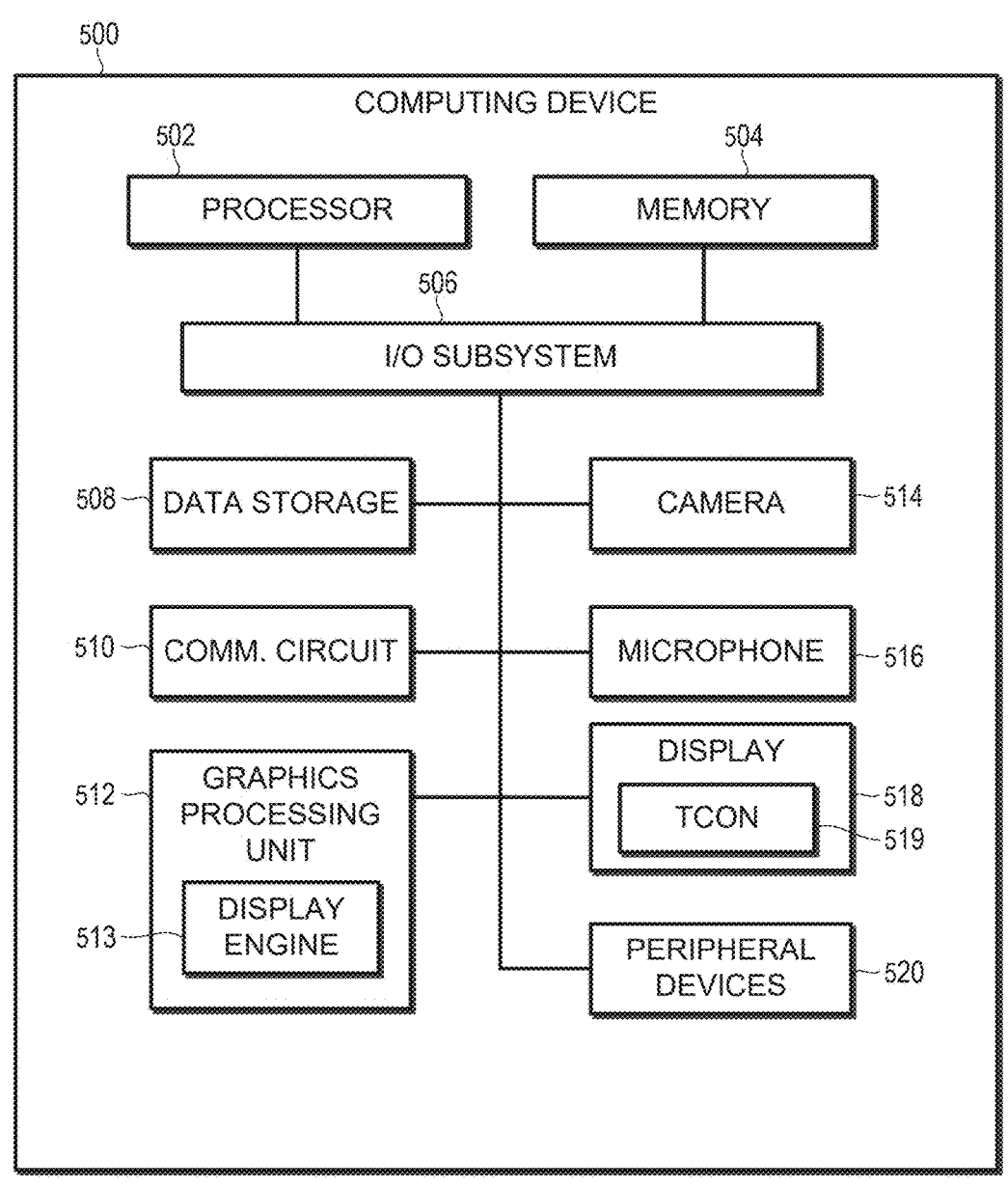
FIG. 5 illustrates a simplified block diagram of a computing device in which aspects of the present disclosure may be incorporated.

FIG. 5 illustrates a simplified block diagram of a computing device in which aspects of the present disclosure may be incorporated. The computing device 500 for selective updating of a display is shown. In use, the illustrative computing device 500 determines one or more regions of a display to be updated. For example, a user may move a cursor and a clock may change from one frame to the next, requiring an update to two regions of a display. The computing device 500 sends update regions from a source to a sink in the display 518 over a link. In the illustrative embodiment, the source does not have direct access to the link port while the sink does have direct access to the link port. The source can send an indication that a particular update message is the last message to be sent for the current frame, after which the source will be entering an idle period without sending update messages. The sink can then place the link in a low-power state to reduce power usage.

The computing device 500 may be embodied as any type of computing device. For example, the computing device 500 may be embodied as or otherwise be included in, without limitation, a server computer, an embedded computing system, a System-on-a-Chip (SoC), a multiprocessor system, a processor-based system, a consumer electronic device, a smartphone, a cellular phone, a desktop computer, a tablet computer, a notebook computer, a laptop computer, a network device, a router, a switch, a networked computer, a wearable computer, a handset, a messaging device, a camera device, and/or any other computing device. In some embodiments, the computing device 500 may be located in a data center, such as an enterprise data center (e.g., a data center owned and operated by a company and typically located on company premises), managed services data center (e.g., a data center managed by a third party on behalf of a company), a co-located data center (e.g., a data center in which data center infrastructure is provided by the data center host and a company provides and manages their own data center components (servers, etc.)), cloud data center (e.g., a data center operated by a cloud services provider that host companies applications and data), and an edge data center (e.g., a data center, typically having a smaller footprint than other data center types, located close to the geographic area that it serves).

The illustrative computing device 500 includes a processor 502, a memory 504, an input/output (I/O) subsystem 506, data storage 508, a communication circuit 510, a graphics processing unit 512, a camera 514, a microphone 516, a display 518, and one or more peripheral devices 520. In some embodiments, one or more of the illustrative components of the computing device 500 may be incorporated in, or otherwise form a portion of, another component. For example, the memory 504, or portions thereof, may be incorporated in the processor 502 in some embodiments. In some embodiments, one or more of the illustrative components may be physically separated from another component.

The processor 502 may be embodied as any type of processor capable of performing the functions described herein. For example, the processor 502 may be embodied as a single or multi-core processor(s), a single or multi-socket processor, a digital signal processor, a graphics processor, a neural network compute engine, an image processor, a microcontroller, or other processor or processing/controlling circuit. Similarly, the memory 504 may be embodied as any type of volatile or non-volatile memory or data storage capable of performing the functions described herein. In operation, the memory 504 may store various data and software used during operation of the computing device 500 such as operating systems, applications, programs, libraries, and drivers. The memory 504 is communicatively coupled to the processor 502 via the I/O subsystem 506, which may be embodied as circuitry and/or components to facilitate input/output operations with the processor 502, the memory 504, and other components of the computing device 500. For example, the I/O subsystem 506 may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations. The I/O subsystem 506 may connect various internal and external components of the computing device 500 to each other with use of any suitable connector, interconnect, bus, protocol, etc., such as an SoC fabric, PCIe®, USB2, USB3, USB4, NVMe®, Thunderbolt®, and/or the like. In some embodiments, the I/O subsystem 506 may form a portion of a system-on-a-chip (SoC) and be incorporated, along with the processor 502, the memory 504, and other components of the computing device 500 on a single integrated circuit chip.

The data storage 508 may be embodied as any type of device or devices configured for the short-term or long-term storage of data. For example, the data storage 508 may include any one or more memory devices and circuits, memory cards, hard disk drives, solid-state drives, or other data storage devices.

The communication circuit 510 may be embodied as any type of interface capable of interfacing the computing device 500 with other computing devices, such as over one or more wired or wireless connections. In some embodiments, the communication circuit 510 may be capable of interfacing with any appropriate cable type, such as an electrical cable or an optical cable. The communication circuit 510 may be configured to use any one or more communication technology and associated protocols (e.g., Ethernet, Bluetooth®, Wi-Fi®, WiMAX, near field communication (NFC), etc.). The communication circuit 510 may be located on silicon separate from the processor 502, or the communication circuit 510 may be included in a multi-chip package with the processor 502, or even on the same die as the processor 502. The communication circuit 510 may be embodied as one or more add-in-boards, daughtercards, network interface cards, controller chips, chipsets, specialized components such as a field-programmable gate array (FPGA) or application-specific integrated circuit (ASIC), or other devices that may be used by the computing device 500 to connect with another computing device. In some embodiments, communication circuit 510 may be embodied as part of a system-on-a-chip (SoC) that includes one or more processors or included on a multichip package that also contains one or more processors. In some embodiments, the communication circuit 510 may include a local processor (not shown) and/or a local memory (not shown) that are both local to the communication circuit 510. In such embodiments, the local processor of the communication circuit 510 may be capable of performing one or more of the functions of the processor 502 described herein. Additionally or alternatively, in such embodiments, the local memory of the communication circuit 510 may be integrated into one or more components of the computing device 500 at the board level, socket level, chip level, and/or other levels.

The graphics processing unit 512 is configured to perform certain computing tasks, such as video or graphics processing. The graphics processing unit 512 may be embodied as one or more processors, data processing unit, field-programmable gate arrays (FPGAs), application-specific integrated circuits (ASICs), and/or any combination of the above. In some embodiments, the graphics processing unit 512 may send frames or partial update regions to the display 518. For instance, the example graphics processing unit 512 includes a display engine 513, which may be embodied as hardware, firmware, software, virtualized hardware, emulated architecture, and/or a combination thereof, and is configured to determine frames to be sent to the display 518 and send the images to the display 518. In the illustrative embodiment, the display engine 513 is part of the graphics processing unit 512. In other embodiments, the display engine 513 may be part of the processor 502 or other component of the device 500.

In certain embodiments, the display engine 513 may include circuitry to implement aspects of the present disclosure, e.g., circuitry to implement the computational aspects described with respect to FIGS. 1A-1B above. For example, the display engine 513 may access frames stored in the memory 504, enhance the frames as described above, and then stream the frames to the display 518.

The camera 514 may include one or more fixed or adjustable lenses and one or more image sensors. The image sensors may be any suitable type of image sensors, such as a CMOS or CCD image sensor. The camera 514 may have any suitable aperture, focal length, field of view, etc. For example, the camera 514 may have a field of view of 60-110° in the azimuthal and/or elevation directions.

The microphone 516 is configured to sense sound waves and output an electrical signal indicative of the sound waves. In the illustrative embodiment, the computing device 500 may have more than one microphone 516, such as an array of microphones 516 in different positions.

The display 518 may be embodied as any type of display on which information may be displayed to a user of the computing device 500, such as a touchscreen display, a liquid crystal display (LCD), a thin film transistor LCD (TFT-LCD), a light-emitting diode (LED) display, an organic light-emitting diode (OLED) display, a cathode ray tube (CRT) display, a plasma display, an image projector (e.g., 2D or 3D), a laser projector, a heads-up display, and/or other display technology. The display 518 may have any suitable resolution, such as 7680×4320, 3840×2160, 1920×1200, 1920×1080, etc.

The display 518 includes a timing controller (TCON) 519, which includes circuitry to convert video data received from the graphics processing unit 512 into signals that drive a panel of the display 518. In some embodiments, the TCON 519 may also include circuitry to implement one or more aspects of the present disclosure. For example, the TCON 519 may include circuitry to implement the computational aspects described with respect to FIG. 1 above. For example, the TCON 519 may enhance frames received from the graphics processing unit 512 and stream the frames to the panel of the display 518.

In some embodiments, the computing device 500 may include other or additional components, such as those commonly found in a computing device. For example, the computing device 500 may also have peripheral devices 520, such as a keyboard, a mouse, a speaker, an external storage device, etc. In some embodiments, the computing device 500 may be connected to a dock that can interface with various devices, including peripheral devices 520. In some embodiments, the peripheral devices 520 may include additional sensors that the computing device 500 can use to monitor the video conference, such as a time-of-flight sensor or a millimeter-wave sensor.

Figure 6:
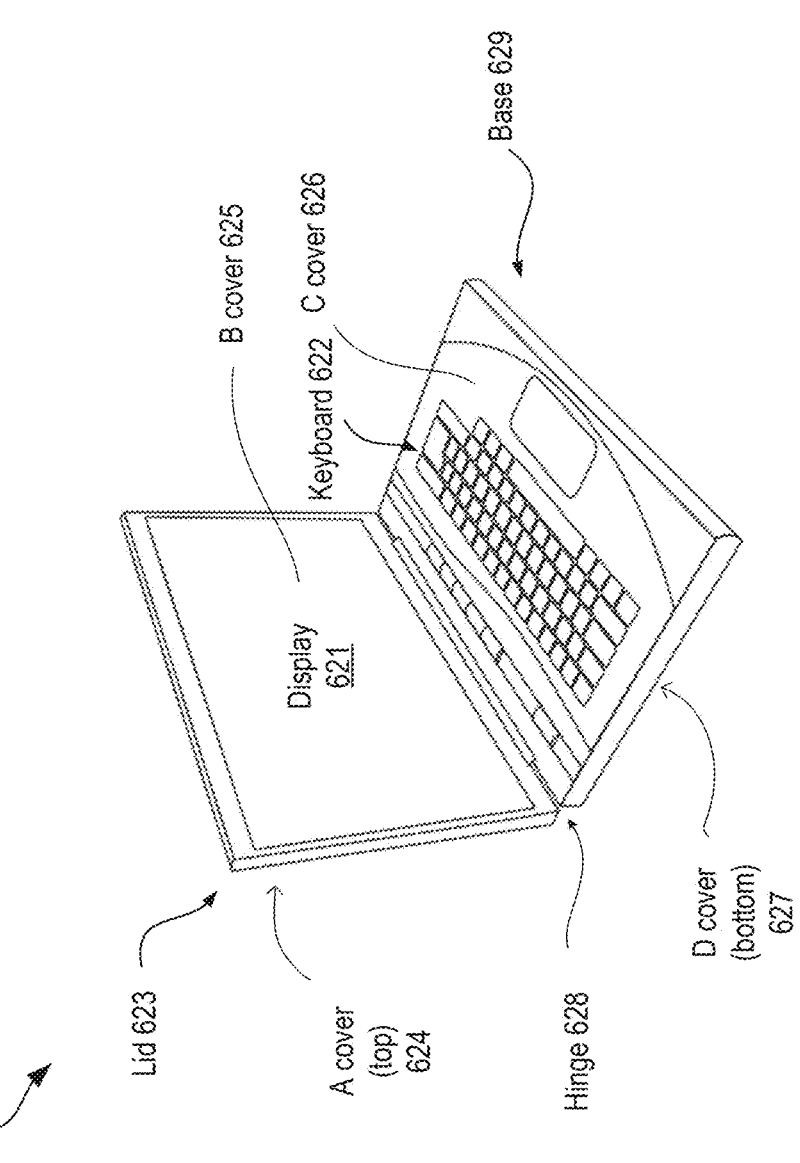
FIG. 6 illustrates an example computing device in which aspects of the present disclosure may be incorporated.

FIG. 6 illustrates an example computing device 600 in which aspects of the present disclosure may be incorporated. The computing device 600 can be a laptop (as shown) or another type of mobile computing device with a similar form factor, such as a foldable tablet or smartphone. In some embodiments, embodiments of present disclosure may be incorporated into a free-standing display monitor, which may be connected to a computing device that outputs image data to the display.

The computing device 600 includes a housing, which includes a lid 623 with an A cover 624 that is a "world-facing" surface of the lid 623 when the computing device 600 is in a closed configuration and a B cover 625 that comprises a user-facing display 621 when the lid 623 is open (e.g., as shown). The computing device 600 also includes a base 629 with a C cover 626 that includes a keyboard 622 that is upward facing when the device 600 is an open configuration (e.g., as shown) and a D cover 627 that forms the bottom of the base 629. In some embodiments, the base 629 includes the primary computing resources (e.g., host processor unit(s), graphics processing unit (GPU)) of the device 600, along with a battery, memory, and storage, and communicates with the lid 623 via wires that pass through a hinge 628 that connects the base 629 with the lid 623. In some embodiments, the computing device 600 can be a dual display device with a second display comprising a portion of the C cover 626. For example, in some embodiments, an "always-on" display (AOD) can occupy a region of the C cover below the keyboard that is visible when the lid 623 is closed. In other embodiments, a second display covers most of the surface of the C cover and a removable keyboard can be placed over the second display or the second display can present a virtual keyboard to allow for keyboard input.

FIG. 7 illustrates an example block diagram of a computing device in which aspects of the present disclosure may be incorporated. The computing device 700 comprises a base 710 connected to a lid 720 by a hinge 730. The mobile computing device (also referred to herein as "user device") 700 can be a laptop or a mobile computing device with a similar form factor. The base 710 comprises a host system-on-a-chip (SoC) 740 that comprises one or more processor units integrated with one or more additional components, such as a memory controller, graphics processing unit (GPU), caches, an image processing module, and other components described herein. For example, the SoC 740 may include one or more of the processor 502, memory 504, I/O subsystem 506, and graphics processing unit 512 of FIG. 5. The base 710 can further comprise a physical keyboard, touchpad, battery, memory, storage, and external ports. The lid 720 comprises an embedded display panel 745, a timing controller (TCON) 750, one or more microphones 758, one or more cameras 760, and a touch controller 765. The TCON

750 converts video data 790 received from the SoC 740 into signals that drive the display panel 745.

The display panel 745 can be any type of embedded display in which the display elements responsible for generating light or allowing the transmission of light are located in each pixel. Such displays may include TFT LCD (thin-film-transistor liquid crystal display), micro-LED (micro-light-emitting diode (LED)), OLED (organic LED), and QLED (quantum dot LED) displays. The display panel 745 can comprise a touchscreen comprising one or more dedicated layers for implementing touch capabilities or 'in-cell' or 'on-cell' touchscreen technologies that do not require dedicated touchscreen layers. A touch controller 765 drives touchscreen technology utilized in the display panel 745 and collects touch sensor data provided by the employed touchscreen technology. The microphones 758 can comprise microphones located in the bezel of the lid or in-display microphones located in the display area, the region of the panel that displays content. The one or more cameras 760 can similarly comprise cameras located in the bezel or in-display cameras located in the display area.

The hinge 730 can be any physical hinge that allows the base 710 and the lid 720 to be rotatably connected. The wires that pass across the hinge 730 comprise wires for passing video data from the SoC 740 to the TCON 750, wires for passing audio data between the microphones 758 and the SoC 740, wires for providing image data from the cameras 760 to the SoC 740, and wires for providing touch data from the touch controller 765 to the SoC 740. In some embodiments, data shown as being passed over different sets of wires between the SoC and various components are communicated over the same set of wires. For example, in some embodiments, all of the different types of data shown can be sent over a single PCIe-based or USB-based data bus. In some embodiments, the lid 720 is removably attachable to the base 710. In some embodiments, the hinge can allow the base 710 and the lid 720 to rotate to substantially 360 degrees with respect to each other.

The components illustrated in FIG. 7 as being located in the base of a mobile computing device can be located in a base housing (e.g., base 629 of the device 600) and components illustrated in FIG. 7 as being located in the lid of a mobile computing device can be located in a lid housing (e.g., lid 623 of the device 600).

Figure 8:
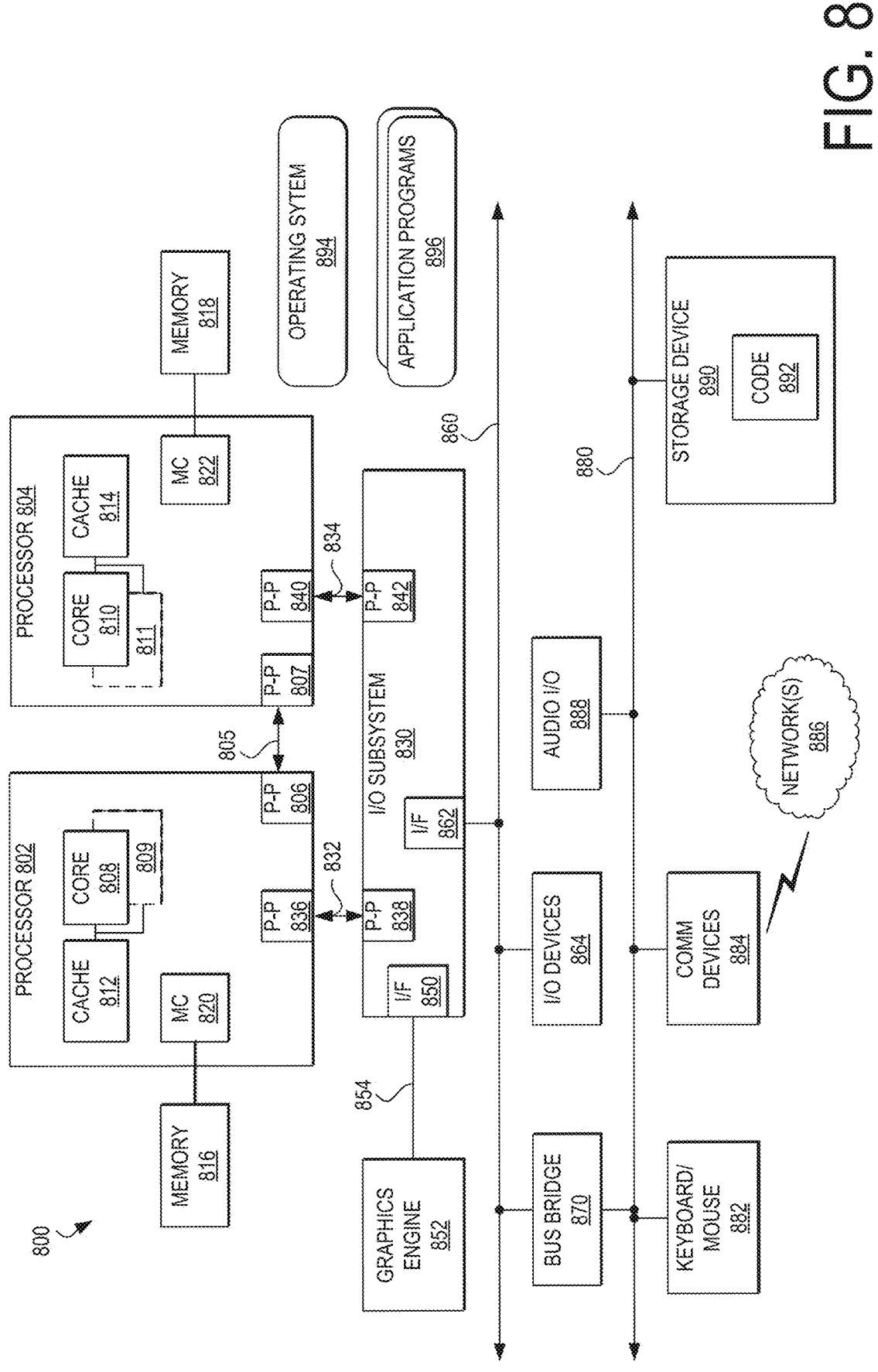
FIG. 8 is a block diagram of computing device components which may be included in a mobile computing device incorporating aspects of the present disclosure.

FIG. 8 is a block diagram of computing device components which may be included in a mobile computing device incorporating aspects of the present disclosure. In some embodiments, the components shown may be implemented within the SoC 740 of FIG. 7, for instance. Generally, components shown in FIG. 8 can communicate with other shown components, although not all connections are shown, for ease of illustration. The components 800 comprise a multiprocessor system comprising a first processor 802 and a second processor 804 and is illustrated as comprising point-to-point (P-P) interconnects. For example, a point-to-point (P-P) interface 806 of the processor 802 is coupled to a point-to-point interface 807 of the processor 804 via a point-to-point interconnection 805. It is to be understood that any or all of the point-to-point interconnects illustrated in FIG. 8 can be alternatively implemented as a multi-drop bus, and that any or all buses illustrated in FIG. 8 could be replaced by point-to-point interconnects.

As shown in FIG. 8, the processors 802 and 804 are multicore processors. Processor 802 comprises processor cores 808 and 809, and processor 804 comprises processor cores 810 and 811. Processor cores 808-811 can execute computer-executable instructions in a manner similar to that discussed below in connection with FIG. 9, or in other manners.

Processors 802 and 804 further comprise at least one shared cache memory 812 and 814, respectively. The shared caches 812 and 814 can store data (e.g., instructions) utilized by one or more components of the processor, such as the processor cores 808-809 and 810-811. The shared caches 812 and 814 can be part of a memory hierarchy for the device. For example, the shared cache 812 can locally store data that is also stored in a memory 816 to allow for faster access to the data by components of the processor 802. In some embodiments, the shared caches 812 and 814 can comprise multiple cache layers, such as level 1 (L1), level 2 (L2), level 3 (L3), level 4 (L4), and/or other caches or cache layers, such as a last level cache (LLC).

Although two processors are shown, the device can comprise any number of processors or other compute resources. Further, a processor can comprise any number of processor cores. A processor can take various forms such as a central processing unit, a controller, a graphics processor, an accelerator (such as a graphics accelerator, digital signal processor (DSP), or artificial intelligence (AI) accelerator)). A processor in a device can be the same as or different from other processors in the device. In some embodiments, the device can comprise one or more processors that are heterogeneous or asymmetric to a first processor, accelerator, field programmable gate array (FPGA), or any other processor. There can be a variety of differences between the processing elements in a system in terms of a spectrum of metrics of merit including architectural, microarchitectural, thermal, power consumption characteristics and the like. These differences can effectively manifest themselves as asymmetry and heterogeneity amongst the processors in a system. In some embodiments, the processors 802 and 804 reside in a multi-chip package. As used herein, the terms "processor unit" and "processing unit" can refer to any processor, processor core, component, module, engine, circuitry or any other processing element described herein. A processor unit or processing unit can be implemented in hardware, software, firmware, or any combination thereof capable of.

Processors 802 and 804 further comprise memory controller logic (MC) 820 and 822. As shown in FIG. 8, MCs 820 and 822 control memories 816 and 818 coupled to the processors 802 and 804, respectively. The memories 816 and 818 can comprise various types of memories, such as volatile memory (e.g., dynamic random-access memories (DRAM), static random-access memory (SRAM)) or non-volatile memory (e.g., flash memory, solid-state drives, chalcogenide-based phase-change non-volatile memories). While MCs 820 and 822 are illustrated as being integrated into the processors 802 and 804, in alternative embodiments, the MCs can be logic external to a processor, and can comprise one or more layers of a memory hierarchy.

Processors 802 and 804 are coupled to an Input/Output (I/O) subsystem 830 via P-P interconnections 832 and 834. The point-to-point interconnection 832 connects a point-to-point interface 836 of the processor 802 with a point-to-point interface 838 of the I/O subsystem 830, and the point-to-point interconnection 834 connects a point-to-point interface 840 of the processor 804 with a point-to-point interface 842 of the I/O subsystem 830. Input/Output subsystem 830 further includes an interface 850 to couple I/O subsystem 830 to a graphics module 852, which can be a high-performance graphics module. The I/O subsystem 830 and the graphics module 852 are coupled via a bus 854. Alternately, the bus 854 could be a point-to-point interconnection.

Input/Output subsystem 830 is further coupled to a first bus 860 via an interface 862. The first bus 860 can be a Peripheral Component Interconnect (PCI) bus, a PCI Express (PCIe) bus, another third generation I/O (input/output) interconnection bus or any other type of bus.

Various I/O devices 864 can be coupled to the first bus 860. A bus bridge 870 can couple the first bus 860 to a second bus 880. In some embodiments, the second bus 880 can be a low pin count (LPC) bus. Various devices can be coupled to the second bus 880 including, for example, a keyboard/mouse 882, audio I/O devices 888 and a storage device 890, such as a hard disk drive, solid-state drive or other storage device for storing computer-executable instructions (code) 892. The code 892 can comprise computer-executable instructions for performing technologies described herein. Additional components that can be coupled to the second bus 880 include communication device(s) or components 884, which can provide for communication between the device and one or more wired or wireless networks 886 (e.g. Wi-Fi, cellular or satellite networks) via one or more wired or wireless communication links (e.g., wire, cable, Ethernet connection, radio-frequency (RF) channel, infrared channel, Wi-Fi channel) using one or more communication standards (e.g., IEEE 802.11 standard and its supplements).

The device can comprise removable memory such as flash memory cards (e.g., SD (Secure Digital) cards), memory sticks, Subscriber Identity Module (SIM) cards). The memory in the computing device (including caches 812 and 814, memories 816 and 818 and storage device 890) can store data and/or computer-executable instructions for executing an operating system 894, or application programs 896. Example data includes web pages, text messages, images, sound files, video data, sensor data, or other data sets to be sent to and/or received from one or more network servers or other devices by the device via one or more wired or wireless networks, or for use by the device. The device can also have access to external memory (not shown) such as external hard drives or cloud-based storage.

The operating system 894 can control the allocation and usage of the components illustrated in FIG. 8 and support one or more application programs 896. The application programs 896 can include common mobile computing device applications (e.g., email applications, calendars, contact managers, web browsers, messaging applications) as well as other computing applications.

The device can support various input devices, such as a touchscreen, microphones, cameras (monoscopic or stereoscopic), trackball, touchpad, trackpad, mouse, keyboard, proximity sensor, light sensor, pressure sensor, infrared sensor, electrocardiogram (ECG) sensor, PPG (photoplethysmogram) sensor, galvanic skin response sensor, and one or more output devices, such as one or more speakers or displays. Any of the input or output devices can be internal to, external to or removably attachable with the device. External input and output devices can communicate with the device via wired or wireless connections.

In addition, the computing device can provide one or more natural user interfaces (NUIs). For example, the operating system 894 or application programs 896 can comprise speech recognition as part of a voice user interface that allows a user to operate the device via voice commands. Further, the device can comprise input devices and components that allows a user to interact with the device via body, hand, or face gestures.

The device can further comprise one or more communication components 884. The components 884 can comprise wireless communication components coupled to one or more antennas to support communication between the device and external devices. Antennas can be located in a base, lid, or other portion of the device. The wireless communication components can support various wireless communication protocols and technologies such as Near Field Communication (NFC), IEEE 1002.11 (Wi-Fi) variants, WiMax, Bluetooth, Zigbee, 4G Long Term Evolution (LTE), Code Division Multiplexing Access (CDMA), Universal Mobile Telecommunication System (UMTS) and Global System for Mobile Telecommunication (GSM). In addition, the wireless modems can support communication with one or more cellular networks for data and voice communications within a single cellular network, between cellular networks, or between the mobile computing device and a public switched telephone network (PSTN).

The device can further include at least one input/output port (which can be, for example, a USB, IEEE 1394 (Fire-Wire), Ethernet and/or RS-232 port) comprising physical connectors; a power supply (such as a rechargeable battery); a satellite navigation system receiver, such as a GPS receiver; a gyroscope; an accelerometer; and a compass. A GPS receiver can be coupled to a GPS antenna. The device can further include one or more additional antennas coupled to one or more additional receivers, transmitters and/or transceivers to enable additional functions.

FIG. 8 illustrates one example computing device architecture. Computing devices based on alternative architectures can be used to implement technologies described herein. For example, instead of the processors 802 and 804, and the graphics module 852 being located on discrete integrated circuits, a computing device can comprise a SoC (system-on-a-chip) integrated circuit incorporating one or more of the components illustrated in FIG. 8. In one example, an SoC can comprise multiple processor cores, cache memory, a display driver, a GPU, multiple I/O controllers, an AI accelerator, an image processing unit driver, I/O controllers, an AI accelerator, an image processor unit. Further, a computing device can connect elements via bus or point-to-point configurations different from that shown in FIG. 8. Moreover, the illustrated components in FIG. 8 are not required or all-inclusive, as shown components can be removed and other components added in alternative embodiments.

Figure 9:
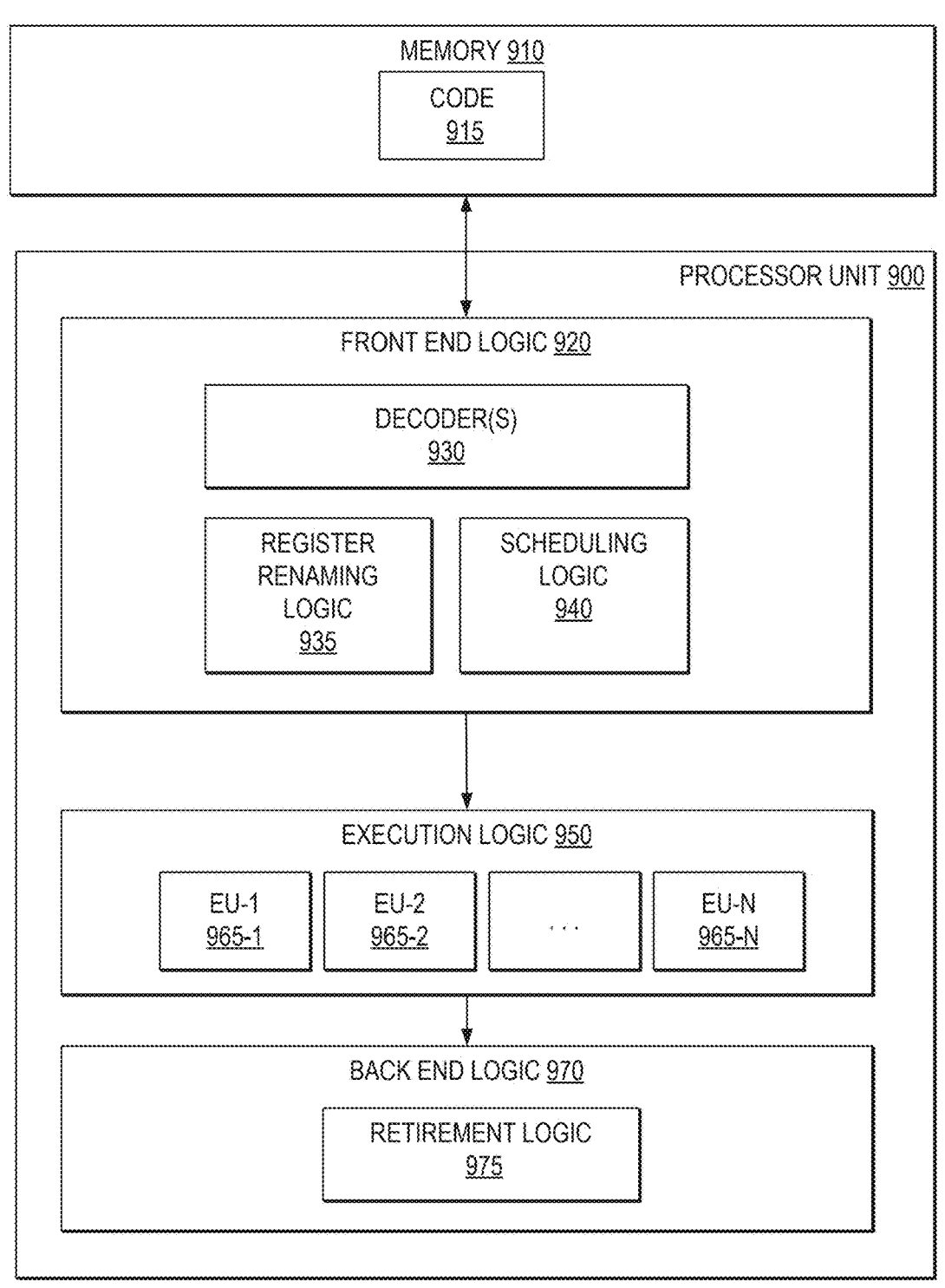
FIG. 9 is a block diagram of an exemplary processor unit that can execute instructions.

FIG. 9 is a block diagram of an example processor unit 900 to execute computer-executable instructions. The processor unit 900 can be any type of processor or processor core, such as a microprocessor, an embedded processor, a digital signal processor (DSP), network processor, or accelerator. The processor unit 900 can be a single-threaded core or a multithreaded core in that it may include more than one hardware thread context (or "logical processor") per core.

FIG. 9 also illustrates a memory 910 coupled to the processor 900. The memory 910 can be any memory described herein or any other memory known to those of skill in the art. The memory 910 can store computer-executable instructions 915 (code) executable by the processor unit 900.

The processor core comprises front-end logic 920 that receives instructions from the memory 910. An instruction can be processed by one or more decoders 930. The decoder 930 can generate as its output a micro operation such as a fixed width micro operation in a predefined format, or generate other instructions, microinstructions, or control signals, which reflect the original code instruction. The front-end logic 920 further comprises register renaming logic 935 and scheduling logic 940, which generally allocate resources and queues operations corresponding to converting an instruction for execution.

The processor unit 900 further comprises execution logic 950, which comprises one or more execution units (EUs) 965-1 through 965-N. Some processor core embodiments can include a number of execution units dedicated to specific functions or sets of functions. Other embodiments can include only one execution unit or one execution unit that can perform a particular function. The execution logic 950 performs the operations specified by code instructions. After completion of execution of the operations specified by the code instructions, back end logic 970 retires instructions using retirement logic 975. In some embodiments, the processor unit 900 allows out of order execution but requires in-order retirement of instructions. Retirement logic 975 can take a variety of forms as known to those of skill in the art (e.g., re-order buffers or the like).

The processor unit 900 is transformed during execution of instructions, at least in terms of the output generated by the decoder 930, hardware registers and tables utilized by the register renaming logic 935, and any registers (not shown) modified by the execution logic 950. Although not illustrated in FIG. 9, a processor can include other elements on an integrated chip with the processor unit 900. For example, a processor may include additional elements such as memory control logic, one or more graphics modules, I/O control logic modules and/or one or more caches.

As used in any embodiment herein, the term "module" refers to logic that may be implemented in a hardware component or device, software or firmware running on a processor, or a combination thereof, to perform one or more operations consistent with the present disclosure. Software may be embodied as a software package, code, instructions, instruction sets and/or data recorded on non-transitory computer-readable storage mediums. Firmware may be embodied as code, instructions or instruction sets and/or data that are hard-coded (e.g., nonvolatile) in memory devices. As used in any embodiment herein, the term "circuitry" can comprise, for example, singly or in any combination, hardwired circuitry, programmable circuitry such as computer processors comprising one or more individual instruction processing cores, state machine circuitry, and/or firmware that stores instructions executed by programmable circuitry. Modules described herein may, collectively or individually, be embodied as circuitry that forms a part of one or more devices. Thus, any of the modules can be implemented as circuitry, such as continuous itemset generation circuitry, entropy-based discretization circuitry, etc. A computer device referred to as being programmed to perform a method can be programmed to perform the method via software, hardware, firmware or combinations thereof.

The use of reference numbers in the claims and the specification is meant as in aid in understanding the claims and the specification and is not meant to be limiting.

Any of the disclosed methods can be implemented as computer-executable instructions or a computer program product. Such instructions can cause a computer or one or more processors capable of executing computer-executable instructions to perform any of the disclosed methods. Generally, as used herein, the term "computer" refers to any computing device or system described or mentioned herein, or any other computing device. Thus, the term "computer-executable instruction" refers to instructions that can be executed by any computing device described or mentioned herein, or any other computing device.

The computer-executable instructions or computer program products as well as any data created and used during implementation of the disclosed technologies can be stored on one or more tangible or non-transitory computer-readable storage media, such as optical media discs (e.g., DVDs, CDs), volatile memory components (e.g., DRAM, SRAM), or non-volatile memory components (e.g., flash memory, solid state drives, chalcogenide-based phase-change non-volatile memories). Computer-readable storage media can be contained in computer-readable storage devices such as solid-state drives, USB flash drives, and memory modules. Alternatively, the computer-executable instructions may be performed by specific hardware components that contain hardwired logic for performing all or a portion of disclosed methods, or by any combination of computer-readable storage media and hardware components.

The computer-executable instructions can be part of, for example, a dedicated software application or a software application that is accessed via a web browser or other software application (such as a remote computing application). Such software can be read and executed by, for example, a single computing device or in a network environment using one or more networked computers. Further, it is to be understood that the disclosed technology is not limited to any specific computer language or program. For instance, the disclosed technologies can be implemented by software written in C++, Java, Perl, Python, JavaScript, Adobe Flash, or any other suitable programming language. Likewise, the disclosed technologies are not limited to any particular computer or type of hardware.

Furthermore, any of the software-based embodiments (comprising, for example, computer-executable instructions for causing a computer to perform any of the disclosed methods) can be uploaded, downloaded or remotely accessed through a suitable communication means. Such suitable communication means include, for example, the Internet, the World Wide Web, an intranet, cable (including fiber optic cable), magnetic communications, electromagnetic communications (including RF, microwave, and infrared communications), electronic communications, or other such communication means.

As used in this application and in the claims, a list of items joined by the term "and/or" can mean any combination of the listed items. For example, the phrase "A, B and/or C" can mean A; B; C; A and B; A and C; B and C; or A, B, and C. Further, as used in this application and in the claims, a list of items joined by the term "at least one of" can mean any combination of the listed terms. For example, the phrase "at least one of A, B, or C" can mean A; B; C; A and B; A and C; B and C; or A, B, and C. Moreover, as used in this application and in the claims, a list of items joined by the term "one or more of" can mean any combination of the listed terms. For example, the phrase "one or more of A, B and C" can mean A; B; C; A and B; A and C; B and C; or A, B, and C.

The disclosed methods, apparatuses and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present or problems be solved.

Although the operations of some of the disclosed methods are described in a particular, sequential order for convenient presentation, it is to be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

Certain non-limiting examples of the presently described techniques are provided below. Each of the following non-limiting examples may stand on its own or may be combined in any permutation or combination with any one or more of the other examples provided below or throughout the present disclosure.

Example 1 is an apparatus comprising: a housing defining at least one inlet opening and at least one outlet opening; a fan within the housing; and a porous material coupled to the housing and disposed over at least a portion of the at least one inlet opening.

Example 2 includes the subject matter of Example 1, wherein the porous material covers at least approximately 10% of an area of the at least one inlet opening.

Example 3 includes the subject matter of Example 1 or 2, wherein the fan comprises a central hub and rotors extending from the hub, and wherein the porous material is disposed over an area of the inlet opening adjacent the rotors of the fan.

Example 4 includes the subject matter of Example 3, wherein the porous material is disposed over a majority of the area of the inlet opening adjacent the rotors of the fan.

Example 5 includes the subject matter of any one of Examples 1-4, wherein at least a portion of the porous material is disposed within the inlet opening.

Example 6 includes the subject matter of any one of Examples 1-5, wherein at least a portion of the porous material extends into the housing.

Example 7 includes the subject matter of any one of Examples 1-6, wherein the porous material comprises an open cell foam material.

Example 8 includes the subject matter of Example 7, wherein the porous material comprises a metal foam material.

Example 9 includes the subject matter of Example 7, wherein the porous material has a porosity of approximately 0.8 to approximately 0.98.

Example 10 includes the subject matter of Example 7, wherein porous material comprises approximately 30 to approximately 300 pores per inch.

Example 11 includes the subject matter of any one of Examples 1-10, wherein the porous material is annular-shaped.

Example 12 includes the subject matter of any one of Examples 1-11, wherein the apparatus further includes a processor and a heat exchanger coupled to the processor, and the at least one outlet opening is disposed adjacent to a portion of the heat exchanger.

Example 13 is a device comprising a device housing; and a blower apparatus within the device housing, the blower apparatus comprising: an inlet opening; an outlet opening; and a porous material disposed over at least a portion of the inlet opening.

Example 14 includes the subject matter of Example 13, wherein the porous material covers at least approximately 10% of an area of the inlet opening.

Example 15 includes the subject matter of Example 13 or 14, wherein the fan comprises a central hub and rotors extending from the hub, and the porous material is disposed over an area of the inlet opening adjacent the rotors of the fan.

Example 16 includes the subject matter of Example 15, wherein the porous material is disposed over a majority of the area of the inlet opening adjacent the rotors of the fan.

Example 17 includes the subject matter of any one of Examples 13-16, wherein at least a portion of the porous material is disposed within the inlet opening.

Example 18 includes the subject matter of any one of Examples 13-17, wherein at least a portion of the porous material extends into the housing.

Example 19 includes the subject matter of any one of Examples 13-18, wherein the porous material comprises an open cell foam material.

Example 20 includes the subject matter of Example 19, wherein the porous material comprises a metal foam material.

Example 21 includes the subject matter of Example 19, wherein the porous material has a porosity of approximately 0.8 to approximately 0.98.

Example 22 includes the subject matter of Example 19, wherein porous material comprises approximately 30 to approximately 300 pores per inch.

Example 23 includes the subject matter of any one of Examples 13-22, wherein the porous material is annular-shaped.

Example 24 includes the subject matter of any one of Examples 13-23, further comprising a processor and memory.

Example 25 includes the subject matter of any one of Examples 13-24, wherein the device housing comprises a base portion and a lid portion.

Example 26 is a system comprising: memory; a processor; a heat exchanger coupled to the processor; and a blower apparatus comprising: an inlet opening; an outlet opening adjacent at least a portion of the heat exchanger; and a porous material disposed over at least a portion of the inlet opening.

Example 27 includes the subject matter of Example 26, wherein the porous material covers at least approximately 10% of an area of the inlet opening.

Example 28 includes the subject matter of Example 26 or 27, wherein the fan comprises a central hub and rotors extending from the hub, and the porous material is disposed over an area of the inlet opening adjacent the rotors of the fan.

Example 29 includes the subject matter of Example 28, wherein the porous material is disposed over a majority of the area of the inlet opening adjacent the rotors of the fan.

Example 30 includes the subject matter of any one of Examples 26-29, wherein at least a portion of the porous material is disposed within the inlet opening.

Example 31 includes the subject matter of any one of Examples 26-30, wherein at least a portion of the porous material extends into the housing.

Example 32 includes the subject matter of any one of Examples 26-31, wherein the porous material comprises an open cell foam material.

Example 33 includes the subject matter of Example 32, wherein the porous material comprises a metal foam material.

Example 34 includes the subject matter of Example 32, wherein the porous material has a porosity of approximately 0.8 to approximately 0.98.

Example 35 includes the subject matter of Example 32, wherein porous material comprises approximately 30 to approximately 300 pores per inch.

Example 36 includes the subject matter of any one of Examples 26-35, wherein the porous material is annular-shaped.

Example 37 includes the subject matter of any one of Examples 26-36, wherein the system comprises a laptop computer, the laptop computer comprising a base portion and a lid portion, the heat exchange apparatus within the base portion of the laptop computer.

The invention claimed is:

1. An apparatus comprising:
a housing defining at least one inlet opening and at least one outlet opening;
a fan within the housing; and
a porous material coupled to the housing and disposed over at least a portion of the at least one inlet opening, wherein a portion of the porous material is coupled to an outer surface of the housing and a portion of the porous material extends into the housing past an inner surface of the housing.

2. The apparatus of claim 1, wherein the porous material covers at least 10% of an area of the at least one inlet opening.

3. The apparatus of claim 1, wherein the fan comprises a central hub and blades extending from the hub, and wherein the porous material is disposed over an area of the inlet opening adjacent the blades of the fan.

4. The apparatus of claim 3, wherein the porous material is disposed over a majority of the area of the at least one inlet opening adjacent the blades of the fan.

5. The apparatus of claim 1, wherein at least a portion of the porous material is disposed within the inlet opening.

6. The apparatus of claim 1, wherein the porous material comprises an open cell foam material.

7. The apparatus of claim 6, wherein the porous material comprises a metal foam material.

8. The apparatus of claim 6, wherein the porous material has a porosity of 0.8 to 0.98.

9. The apparatus of claim 6, wherein the porous material comprises 30 to 300 pores per inch.

10. The apparatus of claim 1, wherein the porous material is annular-shaped.

11. The apparatus of claim 1, wherein the apparatus further includes a processor and a heat exchanger coupled to the processor, and the at least one outlet opening is disposed adjacent to a portion of the heat exchanger.

12. A device comprising:
a device housing; and
a blower apparatus within the device housing, the blower apparatus comprising:
an inlet opening;
an outlet opening; and
a porous material disposed over at least a portion of the inlet opening, wherein a portion of the porous material is coupled to an outer surface of the blower apparatus and a portion of the porous material extends into and past an inner surface of the blower apparatus.

13. The device of claim 12, wherein at least a portion of the porous material is disposed within the inlet opening.

14. The device of claim 12, wherein the porous material comprises an open cell foam material.

15. The device of claim 12, further comprising a processor and memory.

16. The device of claim 12, wherein the device housing comprises a base portion and a lid portion.

17. A system comprising:
memory;
a processor;
a heat exchanger coupled to the processor; and
a blower apparatus comprising:
an inlet opening;
an outlet opening adjacent at least a portion of the heat exchanger; and
a porous material disposed over at least a portion of the inlet opening, wherein a portion of the porous material is on an outer surface of the blower apparatus and extends past an inner surface of the blower apparatus through the inlet opening.

18. The system of claim 17, wherein the porous material is an annular-shape and comprises an open foam material.

19. The system of claim 17, wherein the system comprises a laptop computer, the laptop computer comprising a base portion and a lid portion, the heat exchanger within the base portion of the laptop computer.

* * * * *